United States Patent [19]

Kobayashi et al.

[11] Patent Number: 4,775,790
[45] Date of Patent: Oct. 4, 1988

[54] TRANSMISSION ELECTRON MICROSCOPE

[75] Inventors: Hiroyuki Kobayashi, Mito; Shigeto Isakozawa, Katsuta, both of Japan

[73] Assignee: Hitachi, Ltd., Tokyo, Japan

[21] Appl. No.: 871,852

[22] Filed: Jun. 9, 1986

[30] Foreign Application Priority Data

Jun. 12, 1985 [JP] Japan .................... 60-127580

[51] Int. Cl.$^4$ ............................. H01J 37/26
[52] U.S. Cl. ...................... 250/311; 250/396 R; 250/398
[58] Field of Search .............. 250/311, 396 R, 398, 250/396 ML

[56] References Cited

U.S. PATENT DOCUMENTS

| | | | |
|---|---|---|---|
| 4,494,000 | 1/1985 | Shii et al. | 250/311 |
| 4,520,264 | 5/1985 | Tsuno et al. | 250/311 |
| 4,626,689 | 12/1986 | Tomita et al. | 250/396 R |

FOREIGN PATENT DOCUMENTS 2008124 6/1982 United Kingdom ............... 250/311

Primary Examiner—Bruce C. Anderson
Assistant Examiner—Paul A. Guss
Attorney, Agent, or Firm—Antonelli, Terry & Wands

[57] ABSTRACT

A transmission electron microscope for irradiating a sample with an electron beam and for causing an image formation lens system to enlarge the electron beam having passed through the sample so that a magnified image of the sample is formed by the electron beam. The image formation lens system includes a plurality of lens groups each having a plurality of electromagnetic lenses, and the focal length of each of the electromagnetic lenses included in at least one lens group is changed while keeping the resultant focal length of each lens group constant, to rotate the magnified image in a state that the magnification of the image is kept constant.

8 Claims, 3 Drawing Sheets

TRANSMISSION ELECTRON MICROSCOPE

BACKGROUND OF THE INVENTION

The present invention relates to a transmission electron microscope in which an image rotating/forming lens system can perform a particular operation.

A transmission electron microscope has not been known which can freely rotate the image of a sample while keeping the magnification of the image constant. That is, in conventional transmission electron microscopes, the magnication of an image varies with the rotation thereof.

SUMMARY OF THE INVENTION

It is therefore an object of the present invention to provide a transmission electron microscope in which the image of a sample can be freely rotated while keeping the magnification of the image constant, and moreover operating conditions of electron lens for such image rotation can be readily determined.

In order to attain the above object, according to the present invention, there is provided a transmission electron microscope for irradiating a sample with an electron beam and for causing an image formation lens system to enlarge the electron beam having passed through the sample so that a magnified image of the sample is formed by the electron beam, in which the image formation lens system is formed of a plurality of lens groups each having a plurality of electromagnetic lenses, to rotate the magnified image in such a manner that the focal length of each of the electromagnetic lenses included in each lens group is varied while keeping the resultant focal length of each lens group constant.

DESCRIPTION OF THE PREFERRED EMBODIMENT

Prior to explaining the preferred embodiment of the present invention, the fundamental thought of the invention will be described below in detail.

A rotational angle $\theta$, by which the image of a sample is rotated by means of an electromagnetic lens in an electron microscope, is given by the following equation:

$$\theta = \sqrt{\frac{e}{8mE}} \int B(z)dz = 0.1863 \frac{IN}{\sqrt{E}} \quad (1)$$

where $B(z)$ indicates the magnetic field intensity distribution in a Z-direction, IN the ampere-turn of a coil for forming the electromagnetic lens, and E the electron accelerating voltage. Further, the rotational angle of that final image of a sample which is formed in a transmission electron microscope, is the total sum of rotational angles $\theta_i$ caused by a plurality of electromagnetic lenses which contribute to image rotation.

Figure 1:
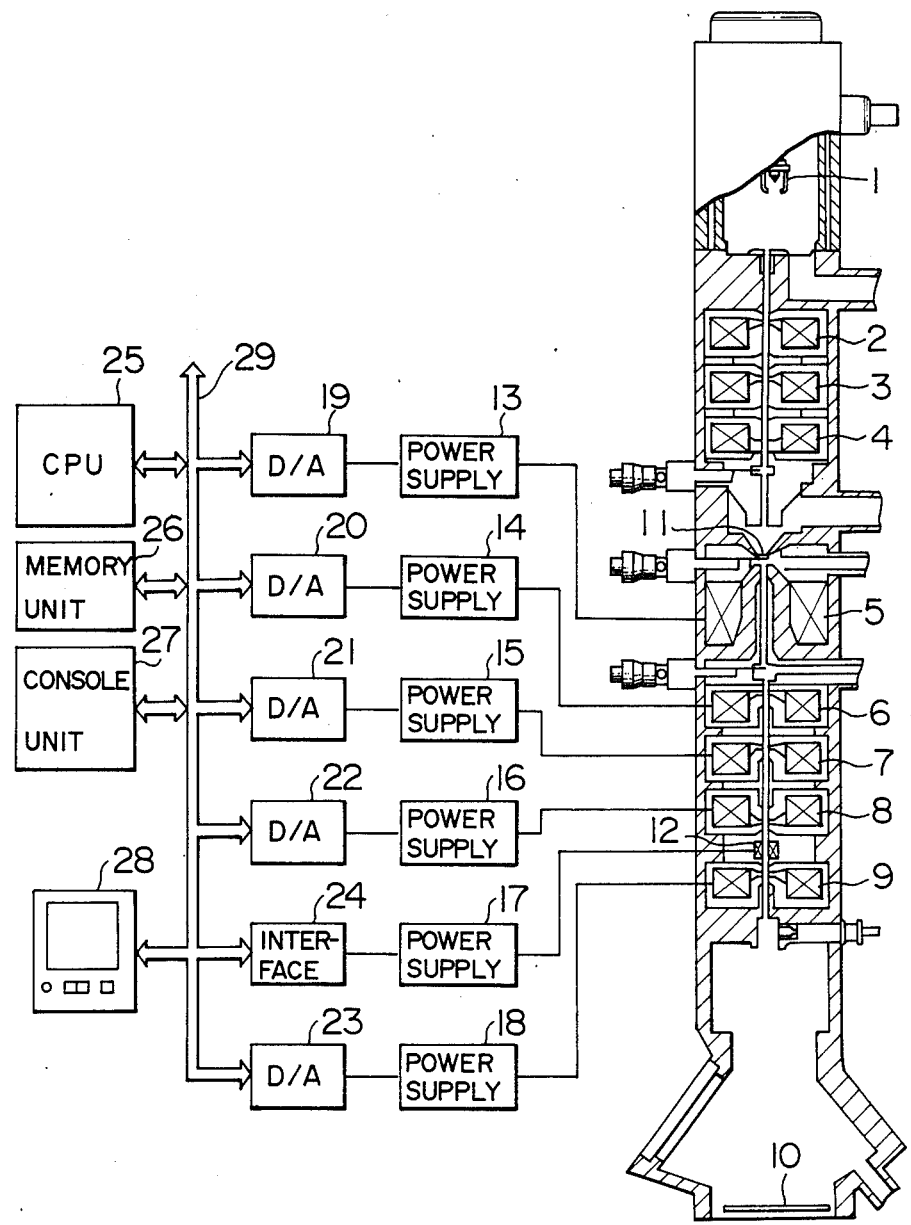
FIG. 1 is a diagram, partly in block and partly schematic, of an embodiment of a transmission electron microscope according to the present invention.

Now, let us consider an image formation lens system which is shown in FIG. 1 and includes five electromagnetic lenses (that is, an objective lens 5, the first intermediate lens 6, the second intermediate lens 7, the first projection lens 8 and the second projection lens 9), by way of example. In this case, the rotational angle $\theta$ of the final image is given by the following equation:

$$\theta = \frac{0.1863}{\sqrt{E}} (I_{obj}N_{obj} + I_{I1}N_{I1} + I_{I2}N_{I2} + I_{P1}N_{P1} + I_{P2}N_{P2}) \quad (2)$$

where suffices obj, I1, I2, P1 and P2 indicate the objective lens, the first intermediate lens, the second intermediate lens, the first projection lens and the second projection lens, respectively.

Further, let us suppose that the exciting current $I_{obj}$ of the objective lens 5 and the electron accelerating voltage E are constant, and that coils for forming the first intermediate lens, the second intermediate lens, the first projection lens and the second projection lens are equal in the number of turns to one another (that is, $N_{I1}=N_{I2}=N_{P1}=N_{P2}$) Then, the equation (2) is rewritten as follows:

$$(I_{I1}+I_{I2})+(I_{P1}+I_{P2})=k_1\theta+k_2 \quad (3)$$

where $k_1$ and $k_2$ are constants.

Thus, in order to carry out the image rotation by the above image formation lens system which includes five electromagnetic lenses, it is necessary to satisfy the equation (3). There are a multiplicity of combinations of values of the exciting currents $I_{I1}$, $I_{I2}$, $I_{P1}$ and $I_{P2}$ which can satisfy the equation (3). Accordingly, it is difficult to find a combination of values of $I_{I1}$, $I_{I2}$, $I_{P1}$ and $I_{P2}$ which is able to rotate the final image by an angle $\theta$ while keeping the magnification of the final image constant.

However, the combination of values of $I_{I1}$, $I_{I2}$, $I_{P1}$ and $I_{P2}$ which can carry out the image rotation in a state that the magnification of the final image is kept constant, can be readily found by using the following method.

The first and second intermediate lenses are considered to form an intermediate lens group, which will be denoted by a suffix I. Further, the first and second projection lenses are considered to form a projection lens group, which will be denoted by a suffix P.

In order to rotate the final image by the angle $\theta$ while keeping the magnification of the final image constant, it is necessary to keep constant both the focal length $f_I$ of the intermediate lens system (namely, the intermediate lens group) and the focal length $f_P$ of the projection lens system (namely, the projection lens group). Each of $f_I$ and $f_P$ is the focal length of a composite lens including two electromagnetic lenses, and hence $f_I$ and $f_P$ are given by the following equations:

$$f_I = \frac{f_{I1}f_{I2}}{f_{I1} + f_{I2} - d_I} \quad (4)$$

$$f_P = \frac{f_{P1}f_{P2}}{f_{P1} + f_{P2} - d_P} \quad (5)$$

where $d_I$ indicates the distance between the first and second intermediate lenses, and $d_P$ the distance between the first and second projection lenses.

As is well known, the focal length f of an electromagnetic lens is given by the following formula:

$$\frac{1}{f} \propto \frac{IN}{\sqrt{E}} \qquad (6)$$

From the equations (4) and (5) and the formula (6), we can obtain the following equations:

$$f_I = f_I(I_{I1}, I_{I2}, d_{I2}) = f_I(I_{I1}, I_{I2}) \qquad (7)$$

$$f_P = f_P(I_{P1}, I_{P2}, d_P) = f_P(I_{P1}, I_{P2}) \qquad (8)$$

Further, the equation (3) can be rewritten as follows:

$$\theta = F(I_{I1}, I_{I2}, I_{P1}, I_{P2}) \qquad (9)$$

In other words, the rotational angle of the final image can be expressed by a linear combination of the exciting currents $I_{I1}$, $I_{I2}$, $I_{P1}$ and $I_{P2}$.

The exciting current $I_{obj}$ of the objective lens is kept constant as mentioned previously, and hence the magnification of the final image does not vary when both the focal length $f_I$ and the focal length $f_P$ are kept constant. However, it can be seen from the equation (9) that when the exciting currents $I_{I1}$, $I_{I2}$, $I_{P1}$ and $I_{P2}$ are changed while keeping both the focal length $f_I$ and the focal length $f_P$ constant, the rotational angle $\theta$ varies. In other words, the rotational angle $\theta$ of the final image can be freely varied without changing the magnification thereof, by changing the exciting currents $I_{I1}$, $I_{I2}$, $I_{P1}$ and $I_{P2}$ (that is, by changing the focal length of each of the lenses 6 to 9) while keeping $f_I$ and $f_P$ constant. In this case, there is a condition that $f_I$ and $f_P$ are kept constant, and hence the number of combinations of values of the exciting currents $I_{I1}$, $I_{I2}$, $I_{P1}$ and $I_{P2}$ capable of producing a predetermined rotational angle $\theta$ is far smaller, as compared with the number of combinations of values of the exciting currents $I_{I1}$, $I_{I2}$, $I_{P1}$ and $I_{P2}$ which can produce the predetermined rotational angle $\theta$ merely in accordance with the equation (3). This means that the operating conditions of the lenses 6 to 9 for rotating the final image by the angle $\theta$ while keeping $f_I$ and $f_P$ constant, can be readily determined.

In more detail, since $f_I$ and $f_P$ are kept constant, we can obtain the following equations from the equations (4) to (8).

$$I_{I2} = g(f_I, I_{I1}, d_I) = g(I_{I1}) \qquad (10)$$

$$I_{P1} = g(f_P, I_{P1}, d_P) = g(I_{P1}) \qquad (11)$$

That is, the exciting current $I_{I2}$ is a function of the exciting current $I_{I1}$, and the exciting current $I_{P2}$ is a function of the exciting current $I_{P1}$.

Further, from the equations (9) to (11), we can obtain the following equation:

$$\theta = F(I_{I1}, g(I_{I1}), I_{P1}, g(I_{P1})) = F(I_{I1}, I_{P1}) \qquad (12)$$

That is, the rotational angle $\theta$ is given by a function of $I_{I1}$ and $I_{P1}$. It is to be noted that each of the equations (3) and (9) indicates a function including four variables $I_{I1}$, $I_{I2}$, $I_{P1}$ and $I_{P2}$, and the equation (12) indicates a function including only two variables $I_{I1}$ and $I_{P1}$. Thus, the number of combinations of values of the exciting currents $I_{I1}$ and $I_{P1}$ capable of producing a predetermined angle $\theta$ in accordance with the equation (12) is far smaller than the number of combinations of values of the exciting currents $I_{I1}$, $I_{I2}$, $I_{P1}$ and $I_{P2}$ capable of producing the above angle in accordance with the equation (3) or (9). That is, the operating conditions of the lenses 6 to 9 for rotating the final image by the angle $\theta$ while keeping the focal length $f_I$ and $f_P$ constant can be readily determined.

The intermediate lens group (or system) and the projection lens group (or system) may be called the first lens group (or system) and the second lens group (or system), respectively. Further, the image formation lens system is not required to include only two lens groups, but may include three or more lens groups. Also, in this case, by changing the exciting currents of individual electromagnetic lenses while keeping the resultant focal length of each lens group constant, the rotational angle of the final image can be varied in a state that the magnification thereof is kept constant. It is needless to say that each lens group is not required to include only two electromagnetic lenses but may include three or more electromagnetic lenses.

The magnification of the final image is determined by the focal length of every electromagnetic lens included in the image formation lens system. However, when the exciting current $I_{obj}$ of the objective lens 5 is kept constant as mentioned previously, the above magnification is determined only by the focal length $f_I$ of the intermediate lens group and the focal length $f_P$ of the projection lens group. Accordingly, in a case where the final image is rotated while holding a desired magnification (that is, a desired combination of $f_I$ and $f_P$), the exciting currents of the lenses 6 to 9 can be readily determined from the equations (7) to (9).

FIG. 1 is a diagram, partly in block and partly schematic, of an embodiment of a transmission electron microscope according to the present invention. Referring to FIG. 1, an electron beam emitted from an electron gun 1 is focused on a sample 11 by an irradiation lens system including electromagnetic lenses 2, 3 and 4. The electron beam having passed through the sample 11 is enlarged by the image formation lens system including the electromagnetic lenses 5 to 9 so as to form the final image of the sample on a fluorescent screen 10 which is observed by an operator.

Exciting currents of all the electromagnetic lenses included in the image formation lens system are controlled by a CPU (namely, central processing unit) 25, and coupled to power supplies 13 to 17 and 18 through D/A converters 19 to 23. Although the exciting currents of all the electromagnetic lenses included in the irradiation lens system are determined in the same manner as mentioned above, current sources and D/A converters for the irradiation lens system are omitted from FIG. 1 for the sake of brevity. An electron beam deflector 12 is controlled by the CPU 25 through an interface 24 and a power supply 17, and is used for preventing a transient image of the sample 11 from appearing on the fluorescent screen 10 in the middle course of image rotation. A memory unit 26 stores not only data on the exciting current and exciting polarity of each electromagnetic lens necessary for rotating the final image in a predetermined range of each of the magnification and the rotational angle, but also all of control programs necessary for controlling the operation of the electron microscope. A console unit 27 is provided with not only a switch for carrying out image rotation but also controls and switches necessary for operating the electron microscope, for example, controls for specifying the magnification and the electron accelerating voltage. The states of these switches and controls are incessantly loaded into the CPU 25. When the state of one of these switches is changed, the CPU 25 controls the present embodiment so that an operation corresponding to the above change in the state of the switch is performed. A CRT display 28 is used for displaying the operating state of the electron microscope and observing conditions, and is controlled by the CPU 25.

When the state of an image rotating control provided on the console unit 27 is changed, this change is loaded into the CPU 25, to determine the rotational angle of the final image. Then, the memory unit 26 is searched for data on the exciting current and exciting polarity of each electromagnetic lens which can produce the above rotational angle while holding the present magnification and satisfying various conditions. The data thus obtained is supplied to the D - A converters 20 to 23, to rotate the final image.

Figure 2:
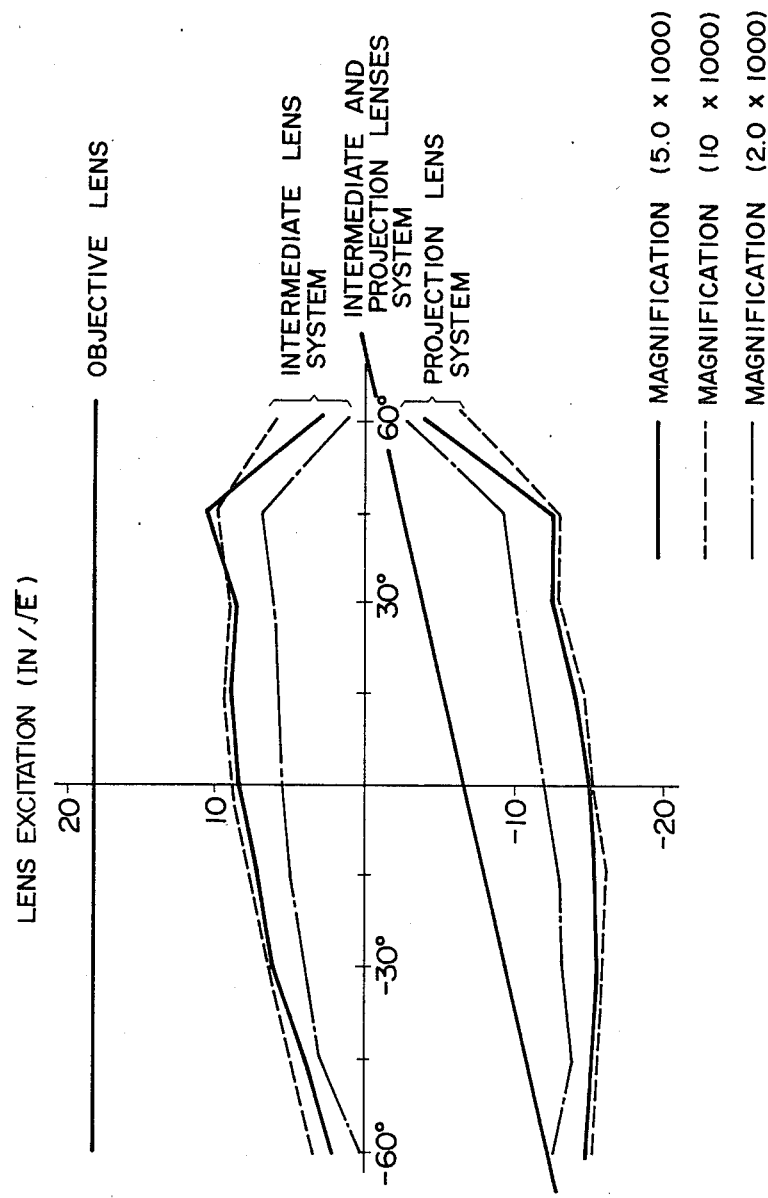
FIG. 2 is a graph showing the relation between the image rotation caused by the image formation lens system included in the embodiment of FIG. 1 and the excitation for this image formation lens system.

Data on the exciting current and exciting polarity of each electromagnetic lens stored in the memory unit 26, includes data on the exciting currents of the projection lens system and intermediate lens system which satisfy the equation (3) in a case where the exciting current of the objective lens 5 is kept constant and the image rotation is carried out by changing the exciting current of the intermediate lens system and the projection lens system. An example of such a data is shown in FIG. 2.

Figure 3:
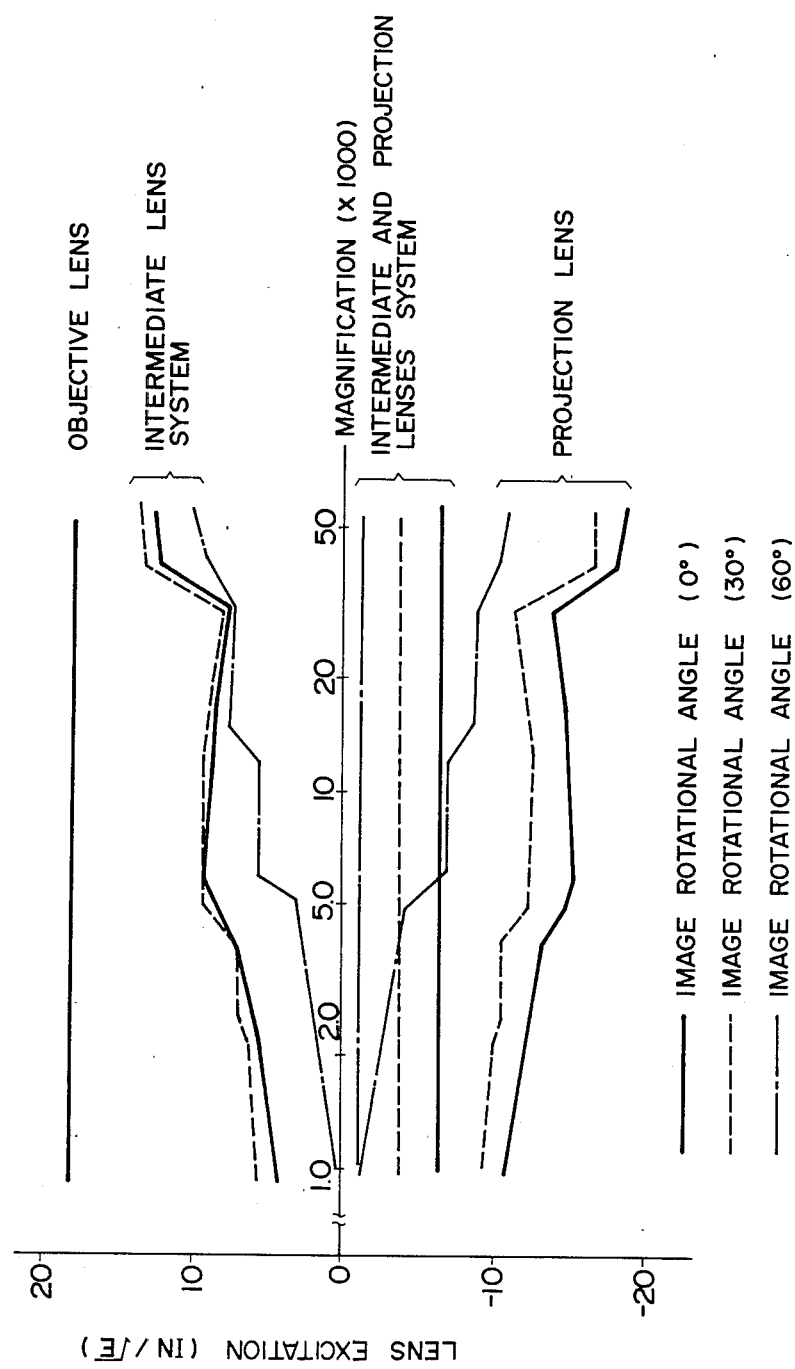
FIG. 3 is a graph showing the relation between the magnification of the image formation lens system included in the embodiment of FIG. 1 and the excitation for this image formation lens system.

Further, the memory unit 26 stores data on the exciting currents of the intermediate lens system and projection lens system which can satisfy the equation (3) in a case where the magnification of the final image is changed while holding the present rotational angle. Accordingly, by outputting the above data to the D/A converters 20 to 23, it is possible to change the magnification of the final image in a state that the final image has been rotated by a predetermined angle. An example of such a data is shown in FIG. 3.

According to the above-mentioned method, it is possible to rotate the final image by a desired angle and to change the magnification of the final image in a state that the final image has been rotated by the desired angle.

However, when the final image is rotated or the magnification of the final image is changed while holding the present rotational angle, the final image may be out of focus. In order to solve this problem, the exciting current $I_{obj}$ of the objective lens 5 is corrected by the CPU 25 on the basis of the following equation:

$$I_{obj} = I_{obj0} + (I_{obj1} - I_{obj2}) \quad (13)$$

where $I_{obj}$ indicates a current value outputted to the D/A converter 19, $I_{obj0}$ a current value at a time immediately before the image rotation or the change in magnification, $I_{obj1}$ a current value which is previously stored in the memory unit 26, and at which the final image is in focus in the same operating condition as used at a time immediately before the image rotation or the change in magnification, and $I_{obj2}$ a current value which is previously stored in the memory unit 26, and at which the final image is in focus in the same operating condition as used at a time after the image rotation or the change in magnification.

Further, when the final image is rotated or the magnification thereof is changed while holding the present rotational angle, a transient image of the sample 11 is observed on the fluorescent screen 10 for a moment, since each electromagnetic lens is slow in response. An operator feels such a transient image to be very strange, and hence it is undesirable to observe the transient image. In the present embodiment, in order to prevent the transient image from being observed, the electron beam is deflected by the deflector 12 at a time immediately before the exciting currents for the image rotation or the change in magnification are outputted to the D/A converters 20 to 23, and is returned to an original position after a period longer than the response time of each of the electromagnetic lenses concerned has elapsed.

The rotational angle $\theta$ of the final image can be determined by the equations (1) and (2), and the angle thus obtained is displayed on the CRT display 28, to prevent an operator from becoming confused.

Further, when the polarity of the exciting current of each electromagnetic lens included in the image formation lens system is changed, the final image can be rotated in a larger angular range, and the magnification thereof can be changed in a wider range.

As has been explained in the foregoing, according to the present invention, the final image of a sample can be rotated by a desired angle in a state that the magnification of the final image is kept constant, and moreover operating conditions of electromagnetic lenses for rotating the final image can be readily determined.

We claim:

1. A transmission electron microscope comprising:
    an electron gun means for emitting an electron beam, said electron beam passing through a sample;
    an image formation lens system including a plurality of lens groups for enlarging said electron beam having passed through said sample so that a magnified image of said sample is formed on an image observing plate by said electron beam, each of said lens groups including a plurality of electromagnetic lenses; and
    control means for changing the focal length of each of said electromagnetic lenses included in at least two of said lens groups while keeping the resultant focal length of each of said at least two lens groups substantially constant, to rotate said magnified image formed on said image observing plate.

2. A transmission electron microscope according to claim 1, wherein said lens groups include an intermediate lens group which is formed of at least first and second intermediate lenses, and a projection lens group which is formed of at least first and second projection lenses.

3. A transmission electron microscope according to claim 1, wherein said image formation lens system further includes an objective lens, and the focal length of said objective lens is kept constant when said magnified image is rotated.

4. A transmission electron microscope comprising:
    an electron gun means for emitting an electron beam, said electron beam passing through a sample;
    an image formation lens system including a plurality of lens groups for enlarging said electron beam having passed through said sample so that a magnified image of said sample is formed on an image observing plate by said electron beam, each of said lens groups including a plurality of electromagnetic lenses; and control means for changing the focal length of each of said electron magnetic lenses included in each of said lens groups while keeping the resultant focal length of each of said lens groups substantially constant, to rotate said magnified image formed on said image observing plate while maintaining the magnification of said magnified image substantially constant.

5. A transmission electron microscope according to claim 4, wherein said plurality of lens groups includes an intermediate lens group which is formed of at least first and second intermediate electromagnetic lenses, and a projection lens group which is formed of at least first and second projection electromagnetic lenses.

6. A transmission electron microscope comprising:
an electron gun means for emitting an electron beam, said electron beam passing through a sample;
an image formation lens system including a plurality of lens groups for enlarging said electron beam having passed through said sample so that a magnified image of said sample is formed on an image observing plate by said electron beam, at least two of said plurality of lens groups including a plurality of electromagnetic lenses; and
control means for changing focal length of each of said electromagnetic lenses included in said at least two of said lens groups while keeping the resultant focal length of said at least two of said lens groups substantially constant, to rotate said magnified image formed on said image observing plate while maintaining the magnification of said magnified image substantially constant.

7. A transmission electron microscope according to claim 6, wherein said image formation lens system further includes an objective lens, and the focal length of said objective lens is kept constant when said magnified image is rotated.

8. A transmission electron microscope according to claim 7, wherein said plurality of lens groups includes an intermediate lens group which is formed of at least first and second intermediate electromagnetic lenses, and a projection lens group which is formed of at least first and second projection electromagnetic lenses.

* * * * *